Figure 1A:
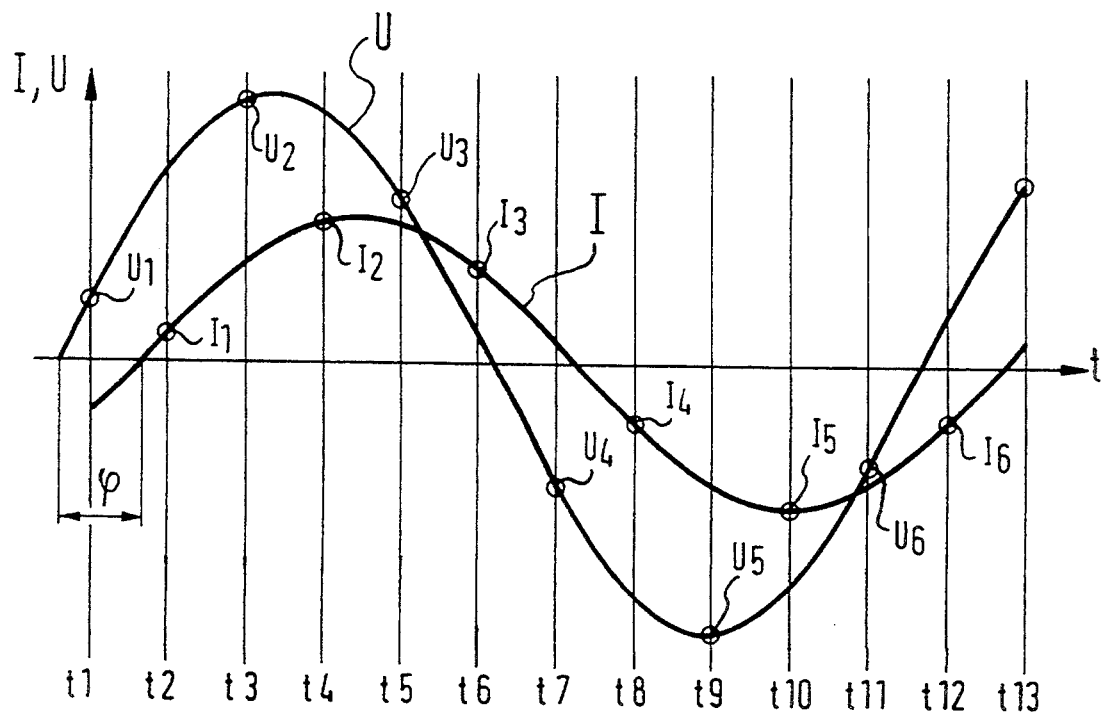

United States Patent [19]
Bierl

[11] Patent Number: 5,446,373
[45] Date of Patent: Aug. 29, 1995

[54] METHOD OF MEASURING THE CONSUMPTION OF ELECTRICAL ENERGY

[75] Inventor: Lutz Bierl, Erding, Germany

[73] Assignee: Texas Instruments Deutschland GmbH, Germany

[21] Appl. No.: 79,666

[22] Filed: Jun. 18, 1993

[30] Foreign Application Priority Data

Jun. 26, 1992 [DE] Germany .......... 42 21 057.7

[51] Int. Cl.$^6$ .................................... G01R 21/06
[52] U.S. Cl. ........................ 324/142; 364/483
[58] Field of Search .............. 324/158 R, 142, 141, 324/103 R; 364/481, 483

[56] References Cited

U.S. PATENT DOCUMENTS

| | | | |
|---|---|---|---|
| 4,663,587 | 5/1987 | MacKenzie | 324/141 |
| 4,884,021 | 11/1989 | Hammond et al. | 324/142 |
| 4,907,165 | 3/1990 | Toda | 364/483 |
| 5,122,735 | 6/1992 | Porter et al. | 324/103 R |

*Primary Examiner*—Vinh Nguyen
*Attorney, Agent, or Firm*—William E. Hiller; Richard L. Donaldson

[57] ABSTRACT

In a method for measuring the consumption of electrical energy by a consumer the momentary values of the alternating voltage and alternating current are measured alternately in the time spacing of a sampling cacle. Each measured momentary value is stored. From the momentary value measured in each sampling period and the stored momentary value the product is formed and the formed products added together. The sum of the products formed is then multiplied by a correction constant depending on the frequency of the alternating current and of the alternating voltage as well as on the sampling period.

3 Claims, 1 Drawing Sheet

METHOD OF MEASURING THE CONSUMPTION OF ELECTRICAL ENERGY

The invention relates to a method of measuring the consumption of electrical energy of a consumer by measuring the alternating voltages applied to the consumer and the alternating current flowing to the consumer at time points corresponding to a prescribed sampling period, forming the product of the measured values and forming the sum of the products for the duration of energy consumption by the consumer.

In the application of this method a microprocessor is employed which is responsible for measuring the momentary values of the alternating voltage and alternating current as well as for forming the product and for summing the products together. The sinusoidal waveforms of the alternating current and the alternating voltage are measured simultaneously in the time spacing of the sampling period. So that the microprocessor is able to process the analog measurement values they must be converted in an analog/digital converter into digital values. Forming the product is then done using the digital values. In actual practice the procedure of measuring and converting the momentary values by means of the microprocessor lasts much longer than the procedure of forming the product. The time periods necessary for this purpose in each case being in the ratio of roughly 7 to 1. This results in the microprocessor requiring almost a complete sampling period to obtain the momentary energy consumption in each case. When this energy consumption is required within the framework of a complicated control process an additional microprocessor needs to be used for the control procedures since the microprocessor required to measure the energy consumption is already fully occupied with this task. This results in a considerable increase in the costs of the hardware required for such a control process.

The invention is based on the object of improving a method of the aforementioned kind so that the time required for measuring the energy consumption is considerably shortened.

This object is achieved according to the invention by alternately measuring the momentary values of the alternating voltage and of the alternating current in the time spacing of the sampling period, by storing each measured momentary value, by forming in each sampling period the product of the momentary value just measured and of the momentary value stored and by multiplying the sum of the products formed with a correction constant depending on the frequency of the alternating current and of the alternating voltage as well as on the sampling period.

In applying the method according to the invention only a single measurement procedure is carried out in each sampling period so that a microprocessor responsible for the measurement is relieved to the extent that it is able to carry out further operations in each sampling period. It could, for example, handle the tasks required in a control process so that no second microprocessor needs to be employed for this purpose.

Figure 1B:
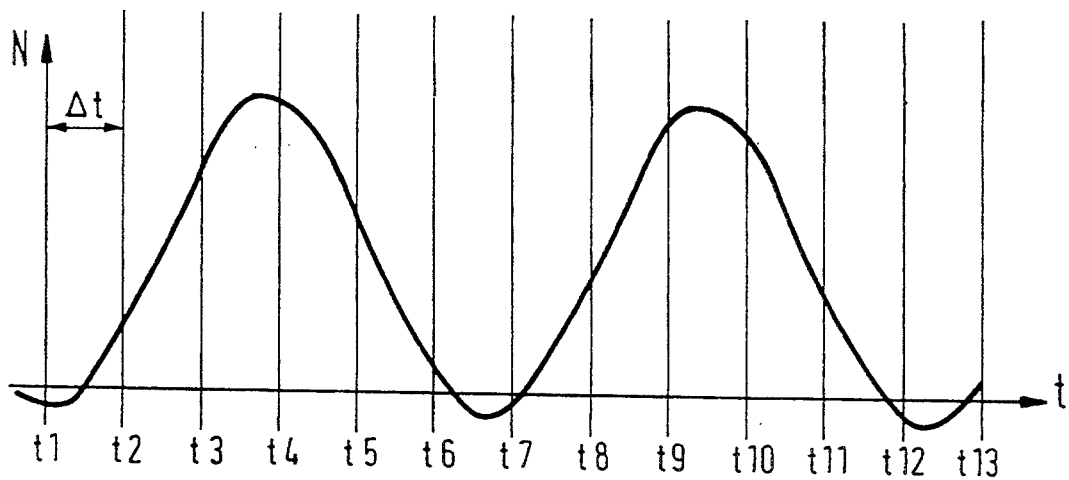

The invention will now be explained with reference to the drawing in which:

FIG. 1a is a graphical diagram showing the time profile of an alternating voltage and of an alternating current; and FIG. 1b is a graphical diagram showing the time profile of the power measured from the alternating voltage and alternating current data of FIG. 1a.

In implementing the method to be described the alternating voltage U applied to a consumer and the alternating current I flowing to this consumer are measured at subsequent time points t1, t2 ... tn, the spacing of the individual time points t1, t2 ... tn corresponding to the sampling period $\Delta t$. In FIG 1a of the drawing the curve depicting the alternating voltage and the curve depicting the alternating current are designated U and I respectively. The alternately measured momentary values of the voltage and current are stored, this meaning that first the voltage $U_1$ is measured and the momentary value obtained is stored, before the current $I_1$ is measured. As soon as this momentary value $I_1$ is available the product of the stored voltage value $U_1$ and the current value $I_1$ just measured is formed. The measured current value $I_1$ is then stored. Then at time point t3 the measurement of the voltage $U_2$ is made followed by forming the product of the stored current value $I_1$ and the measured voltage value $U_2$. The voltage value $U_2$ is again stored. This alternating sequence of a measurement and forming a product is then continuously repeated. By summing up the product results obtained in each case the energy consumption of a consumer can be obtained as shown in FIG. 1b.

It will be seen from the FIG. 1a of the drawing that there is a phase shift $\rho$ between the voltage curve and the current curve. Except for exclusive active power consumers this phase shift, which is always present, can be ignored in the following considerations as to the accuracy of the measurement method described. Due to the fact that forming the product always requires the multiplication of two monentary values which have been measured at two time points spaced away from each other according to the sampling period $\Delta t$, a measurement error would result having the effect as if an additional phase shift existed between the voltage curve and the current curve, if no additional measures are taken. By computing the products in the aforementioned way a constant measurement error results having the value $\cos(\Delta t \cdot 2\Pi f)$ where $\Delta t$ is the already mentioned sampling period, whilst f is the frequency of the alternating voltage and of the alternating current. Since both the sampling period and the frequency of the alternating voltage as well as that of the alternating current are constant parameters, the measurement error can be compensated by multiplying the product with the reciprocal of the stated value. In this way the measurement error resulting from the time spacing of the two values involved in forming the product can be completely compensated.

The energy consumed can be expressed for the method as described by the equation:

$$P = \frac{1}{\cos(\Delta t \cdot 2\pi f)} \cdot K \cdot \Sigma(U_{tn} \cdot I_{tn+1} + I_{tn+1} \cdot U_{tn+2})$$

The parameter K in the equation is a so-called hardware constant which depends on the nature of the current and voltage sensors used as well as on the analog/digital conversion employed and also on the amplification factors of the electronic circuits used.

Since only a single measurement procedure needs to be carried out in application of the method according to the invention, the microprocessor employed for measuring energy consumption can also be used to handle other tasks since it is able to complete the measurement procedure and the subsequent procedure of forming the product in a much shorter time than that of the sampling period. In a practical example a sampling frequency of 10 kHz is used, corresponding to a sampling period of 0.1 ms. The frequency f corresponds to the line frequency of 50 Hz. A conventional microprocessor has no problem in implementing the measurement procedure and forming the product in the time which is less than half of the stated sampling period.

I claim:

1. A method of determining the electrical energy consumption by a consumer, said method comprising:

alternately sampling the analog value of an alternating voltage and an alternating current flowing to the consumer over a plurality of time points with successive time points corresponding to a prescribed sampling period;

measuring the alternating voltage at a first time point to obtain a momentary value of the alternating voltage;

storing the momentary value of the alternating voltage;

thereafter measuring the alternating current at a second time point to obtain a momentary value of the alternating current, with the time interval between the first and second time points defining a sampling period;

forming a product of the stored momentary value of the alternating voltage and the momentary value of the alternating current;

storing the momentary value of the alternating current;

measuring the alternating voltage at a third time point to obtain a second momentary value of the alternating voltage;

forming a product of the stored momentary value of the alternating current and the second momentary value of the alternating voltage;

repeating the sequence of measuring, alternating between the alternating current and the alternating voltage, forming a product, and storing the momentary value, alternating between the momentary value of the alternating voltage and the momentary value of the alternating current;

making an initial determination of the energy consumption by the consumer by summing each of the products so formed to provide a composite product sum; and providing a corrected determination of the energy consumption by the consumer by compensating for errors introduced into the composite product sum by multiplying the composite product sum with a correction constant dependent upon the frequency of the alternating voltage and the alternating current, as well as upon the sampling period.

2. A method according to claim 1, wherein said correction constant has the value $$\frac{1}{\cos(\Delta t \cdot 2\pi f)}$$

where $\Delta t$ is the sampling period and f is the frequency of the alternating current and of the alternating voltage.

3. A method according to claim 1, wherein the measuring of the alternating voltage and of the alternating current in an alternating sequence is accomplished by employing a microprocessor for performing the measuring; and limiting the measuring by the microprocessor to a single measurement procedure in each sampling period, thereby enabling the microprocessor to perform other operation tasks in each sampling period.

* * * * *